United States Patent
Tomishima (10) Patent No.: US 6,580,092 B2
(45) Date of Patent: Jun. 17, 2003

(54) SEMICONDUCTOR CHIP, SEMICONDUCTOR DEVICE, AND PROCESS FOR PRODUCING A SEMICONDUCTOR DEVICE

(75) Inventor: Shigeki Tomishima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/908,610

(22) Filed: Jul. 20, 2001

(65) Prior Publication Data

US 2002/0093014 A1 Jul. 18, 2002

(30) Foreign Application Priority Data

Jan. 15, 2001 (JP) ......................................... 2001-006677

(51) Int. Cl.[7] ............................................... H01L 23/58
(52) U.S. Cl. ......................................... 257/48; 257/786
(58) Field of Search ................................... 257/48, 786

(56) References Cited

U.S. PATENT DOCUMENTS 6,133,054 A * 10/2000 Henson ........................ 438/17

6,429,675 B2 * 8/2002 Bell ............................ 324/765

FOREIGN PATENT DOCUMENTS

| JP | 2726993 | 12/1997 |
|----|---------|---------|
| JP | 11-168185 | 6/1999 |
| JP | 11-214448 | 8/1999 |
| JP | 2000-114452 | 4/2000 |

* cited by examiner

*Primary Examiner*—Jerome Jackson
(74) *Attorney, Agent, or Firm*—McDermott, Will & Emery (57) ABSTRACT

Obtainable are a semiconductor chip making it possible to perform a thoroughgoing test easily without imposing a burden on the circuit of its body; a semiconductor device on which the semiconductor chip is mounted; and a process for producing the semiconductor device. The semiconductor chip includes a first test terminal connected to a terminal line that extends from a body of the chip, the test terminal being a terminal for being jointed to a test device, and a circuit-constituting terminal branched from the terminal line and connected to the terminal line that is connected to the first test terminal, the circuit-constituting terminal being a terminal for being connected to any other circuit element.

6 Claims, 7 Drawing Sheets

SEMICONDUCTOR CHIP, SEMICONDUCTOR DEVICE, AND PROCESS FOR PRODUCING A SEMICONDUCTOR DEVICE

BACKGROUND OF THE INVENTION

1. Field of the Invention

The present invention relates to a semiconductor chip, a semiconductor device on which a semiconductor chip is mounted, and a process for producing a semiconductor device, and more specifically to a semiconductor chip, such as a DRAM, an SRAM, a flash memory, a central processing unit (CPU), a micro-processing unit (MPU) or a digital system processor (DSP), having a terminal for making a test thereof easy, a semiconductor device on which such a semiconductor chip is mounted, and a process for producing such a semiconductor device.

2. Description of the Background Art

Figure 10:
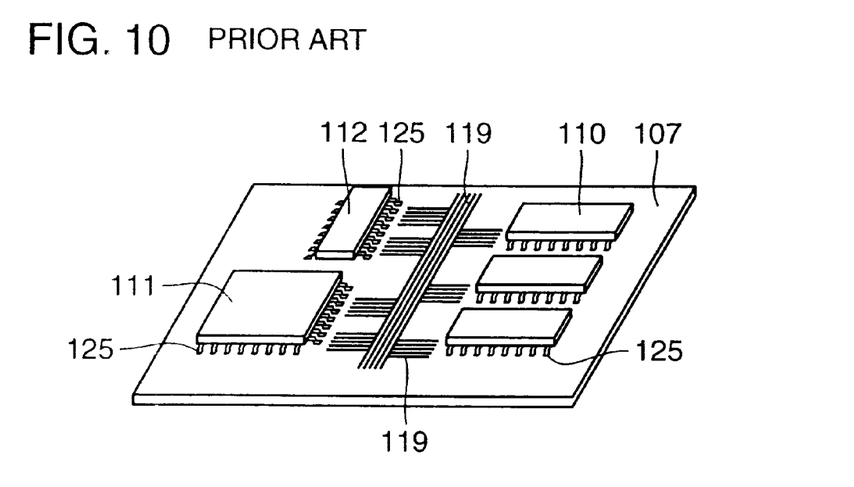
FIG. 10 is a perspective view of a conventional semiconductor device of a dimensional consolidation type.

In many cases, a system composed of a combination of a memory such as a DRAM, an SRAM or a flash memory with a CPU, an MPU or a DSP is produced and used as one system unit. FIG. 10 is a view illustrating an example produced at the earliest times when such a system semiconductor device was distributed. A memory semiconductor chip 110 is connected to a CPU 111 and a DSP 112, which are logic semiconductor chips, through its leads 125 and substrate wiring 119, and they are mounted on a single wiring substrate 107. Distribution of such a system semiconductor device made it possible to select and use a desired system without requiring many steps for design of the system and so on. A drawback of this system semiconductor device is that its size becomes large so that it is unsuitable for use in a portable terminal or the like device.

Figure 11:
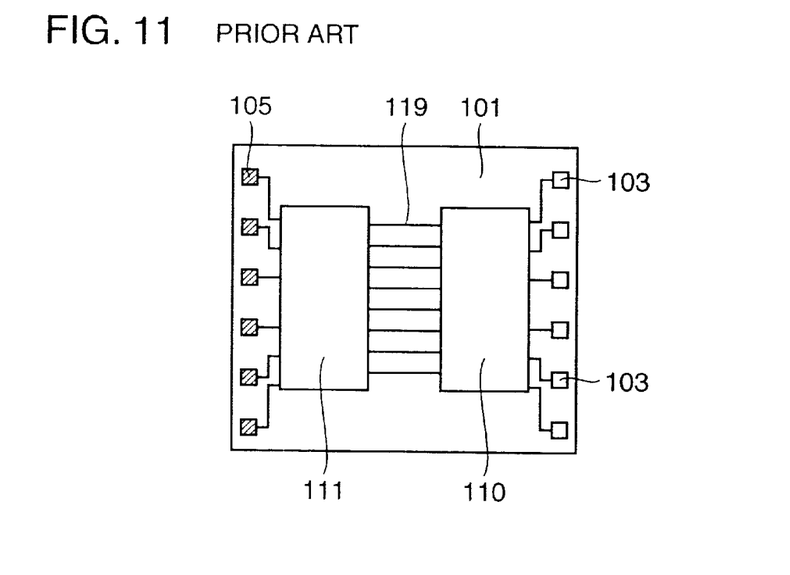
FIG. 11 is a plan view of a semiconductor device formed into one chip on a plane.

FIG. 11 is a view illustrating a one-chip consolidation semiconductor device wherein plural semiconductor circuits are consolidated on a plane to make its size small. This device is a device suggested to overcome the above-mentioned problem. In this semiconductor device, respective semiconductor blocks are integrated with each other and formed on a single semiconductor substrate. Specifically, in this one-chip consolidation semiconductor device, a memory semiconductor block 110 and a logic semiconductor block 111 are simultaneously made on a semiconductor substrate 101 in the same processing step. For this reason, semiconductor circuits having different purposes are formed on respective areas in the single semiconductor substrate. The respective semiconductor circuit blocks are connected to each other through metal wires 119 made at the same time when the semiconductor circuit blocks themselves were made. In this one-chip consolidation semiconductor device, test terminals (testing terminal) 103 that are to be connected to a tester and circuit-constituting terminals 105 that are to be connected to terminals of any other element are separately connected to wires for terminals that are extended from the respective semiconductor chips themselves, and constitute rows. It has been promoted that system semiconductor devices are made small and thin, using such a one-chip consolidation semiconductor device.

However, the above-mentioned one-chip consolidation semiconductor device has the following problem. A memory semiconductor circuit such as a DRAM has a much complicated structure and it must be produced through a very troublesome process for forming memory cells. On the other hand, a logic circuit such as a CPU has a simple structure so that the process for producing the same is also relatively simple. In the case that logic circuits are produced on a semiconductor substrate in a one-chip consolidation semiconductor device at the same time when memories are produced, blocks of the logic circuits are subjected to useless heat treatment and so on for a long time so that the performance of the system may become bad. This causes a problem that by adopting one-chip consolidation, the date of delivery of the semiconductor devices is delayed and the entire structure of the memories and the logic circuits becomes complicated so that the yield of the devices drops. Therefore, difficulty becomes larger about one-chip consolidation semiconductor devices as the devices are becoming more minute so that the capacity of their memories becomes larger.

Figure 12A:
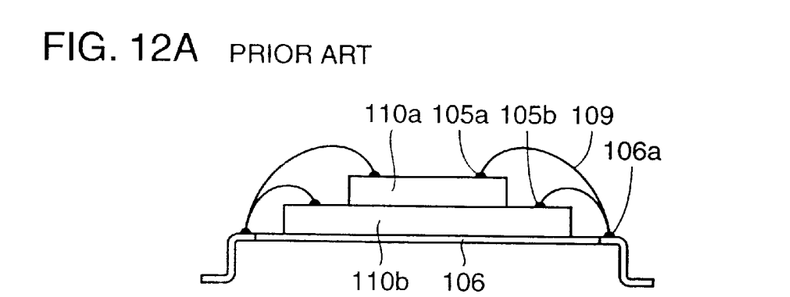
FIG. 12A is a sectional view of a conventional semiconductor device of a stack consolidation type.
Figure 12B:
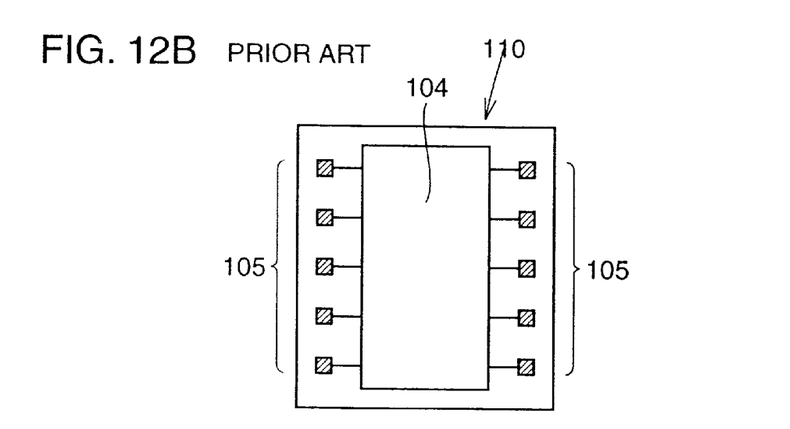
FIG. 12B is a plan view of a semiconductor chip constituting the semiconductor device.

To overcome this problem, stack-type consolidation chips as shown in FIGS. 12A and 12B are suggested (Japanese Patent Laying-Open No. 2000-114452 (2000), Japanese Patent Laying-Open No. 11-214448 (1999) and so on). FIG. 12A is a sectional view of a semiconductor device wherein semiconductor chips are stacked and mounted, and FIG. 12B is a plan view of each semiconductor chip in the semiconductor device. In FIG. 12A, respective stacked chips 110a and 110b are beforehand produced and their performance is tested before the chips are stacked. Thus, it is checked whether the chips get through the test or not. In a packaging step, the following is merely performed: terminals 105a and 105b of the semiconductor chips mounted on a die pad 106 are connected through a wire 109 and the terminal 105b and a lead terminal 106a are connected through another wire 109. Therefore, the logic semiconductor chip is not subjected to any long-sustained heat treatment required for producing memories, so that a high yield can be kept in the production of large-scale integrated system semiconductor devices. As illustrated in FIG. 12B, all of the terminals of the semiconductor chips constituting a package are composed of circuit-constituting terminals 105. The semiconductor chips are tested using the circuit-constituting terminals.

However, in the semiconductor chips having only the circuit-constituting terminals shown in FIG. 12B, the circuit-constituting terminals also function as test terminals. Thus, it may be impossible that appropriate wiring for terminals is led out from a site necessary for the test and then the test is performed. Specifically, no terminals may be set up at sites where an examiner wants to obtain testing signals actually since the real terminals are set up mainly to constitute circuits. For a thoroughgoing test, it is necessary that respective terminals of the individual terminal output an intense signal to a test device. For this, it is necessary that a driver etc. for outputting such an intense signal are fitted up to each of the semiconductor chips. If such a driver is fitted up, problems as follows arise: parasitic capacitance is generated; the structure of the circuits becomes still more complicated; and electric current consumption increases. In circuit-design and actual production of consolidated semiconductor chips, it is a heavy load to add such drivers and the like elements. It is therefore desired to avoid the fitting-up of the driver in each of the chip circuits. However, if a driver as described above is not fitted up to a certain semiconductor chip, the output signal is weak. As a result, for example, the semiconductor chip cannot be tested at a high speed. Needless to say, it is desired that the performance of semiconductor chips having a minute and complicated circuit is checked in a thoroughgoing test and then the chips are forwarded.

SUMMARY OF THE INVENTION

An object of the present invention is to provide a semiconductor chip that can easily be subjected to a thoroughgoing test without imposing a burden on its circuit; a semiconductor device on which such a semiconductor chip is mounted; and a process for producing such a semiconductor device.

The semiconductor chip of the present invention includes a first test terminal connected to a terminal line that extends from a body of the chip, the first test terminal being a terminal for being jointed to a test device; and a circuit-constituting terminal branched from the terminal line and connected to the terminal line, the circuit-constituting terminal being a terminal for being connected to any other circuit element.

Since the circuit-constituting terminal and the first test terminal are terminals different from each other, this structure makes it possible to arrange the two terminals at a position convenient for the structure of the circuit and at a position convenient for a test, respectively. The above-mentioned other circuit element may be a semiconductor chip or a circuit element that is not any semiconductor chip. As it is naturally assumed, the present semiconductor chip may include not only the above-mentioned terminals but also a power source terminal for the body of the semiconductor chip, a ground terminal and the like terminals well-known in the present field. The present chip also includes not only the first test terminal and the circuit-constituting terminal that are branched from each other but also a line for a terminal to which only the test terminal is connected and a line for a terminal to which only the circuit-constituting terminal is connected. The semiconductor chip of the present invention corresponds to a memory semiconductor chip such as a DRAM, an SRAM, a flash memory or an EPROM (erasable programmable read only memory); or a logic semiconductor chip such as a CPU, an MPU or a DSP.

The semiconductor chip of the present invention may further include, for example, a second test terminal connected to a test terminal line.

The test terminal line wherein only the second test terminal is connected in the above description means a line, for a terminal, to which no circuit-constituting terminal is connected. According to this structure, the test terminal can be set up by extending the terminal line from a body position convenient for a test, regardless of any circuit-constituting terminal, so that the test can be performed. Therefore, the property of the semiconductor chip such as a complicated memory can be thoroughly tested.

The semiconductor chip of the present invention, may further include, for example, a driver disposed at a position between the first test terminal and the branch point.

In the semiconductor chip of the present invention, for example, the driver is for amplifying a signal to the test device.

This structure makes it possible to test the semiconductor chip sufficiently at a high-speed without setting up, to the body of the semiconductor chip, a circuit for outputting a signal having an intensity unnecessary for the circuit structure made together with any other block, for example, a driver. Therefore, the semiconductor chip whose performance has been checked can be provided without generating parasitic capacitance in the body or imposing excessive burden on the circuit structure. The driver means a circuit element for amplifying a signal intensity in order that a weakly-driven signal can cope with a heavy load. Specifically, the driver corresponds to an inverter circuit and a lot of other amplifying circuit elements. The test terminal can be referred to, in the case that an outputting terminal and an inputting terminal are divided from each other, as an outputting terminal.

In the semiconductor chip of the present invention, for example, the driver is for transmitting a signal from the test device to the semiconductor chip.

Since the intensity of an input signal from the test device can be freely adjusted by the test device, the above-mentioned driver is a driver having a property for shaping waveforms rather than a driver having a property for increasing driving power. Therefore, its channel width may be relatively small. Needless to say, however, the above-mentioned drive may be a driver for increasing driving power. The test terminal may be referred to, in the case that an inputting terminal and an outputting terminal are divided from each other, as the inputting terminal.

In the semiconductor chip of the present invention, for example, the driver is composed of an inverter circuit including a Metal Oxide Semiconductor (MOS) transistor.

This structure makes it possible to form the inverter circuit including the MOS transistor compactly between the branch portion where the circuit-constituting terminal is branched and the test terminal. For this reason, a sufficiently intense output signal for a test can be outputted without imposing a burden on the body of the semiconductor chip.

In the semiconductor chip of the present invention, for example, the following is desired: the inverter circuit is composed of multistage inverter circuits; and in two MOS transistors in the inverter circuits adjacent to each other, the channel width of the MOS transistor in the inverter circuit nearer to the side to which the signal is transmitted is longer.

This simple structure makes it possible to output a sufficiently intense testing signal without imposing a heavy burden. In order to obtain a signal whose rise is sharp to generate no delay, the extent for increasing the channel width is as follows. The fanning-out ratio, which is the ratio between the channel width of any inverter circuit and that of the inverter circuit next thereto, is desirably from 2 to 5.

The semiconductor chip of the present invention may further include, for example, a driver power source terminal for the driver.

By separating a power source terminal of the semiconductor chip body from the driver power source terminal for the test terminals, it is possible to output more surely a signal having an intensity sufficient for a test and input more surely a signal whose waveform is shaped without increasing the parasitic capacitance of the circuit of the chip body or making the circuit structure complicated. Wires for the driver power source are extended from the driver power source terminal and connected to the respective drivers.

In the semiconductor chip of the present invention, for example, a plurality of the circuit-constituting terminals and a plurality of the first test terminals may be arranged in the form of rows along an edge of the semiconductor chip, as viewed in plan.

By arranging the circuit-constituting terminals along the edge, the entire circuit can be made in the state that the length of the lines between the elements is short. By arranging the first test terminals along the edge, the length of the lines from the branch portions of the circuit-constituting terminals can also be made short.

In the semiconductor chip of the present invention, for example, the following desired: the first test terminals are arranged along the edge and at positions nearer to the edge than the circuit-constituting terminals are arranged, as viewed in plan.

By making the first test terminals nearer to the edge than the circuit-constituting terminals, the first test terminals can be separated off after completion of the test and before packaging, for example, at the time of dicing. Thus, the semiconductor chip can be made small-sized.

In the semiconductor chip of the present invention, for example, the following is desired: a mark is made to divide the row of the first test terminals from the row of the circuit-constituting terminals.

This mark makes it possible to make a cutting portion clear and cut the edge portion at an appropriate position without fail. This mark may be a merely drawn line, or a cutting groove, a notch or perforations making the cutting or separation easy.

The semiconductor chip of the present invention may be, for example, a memory semiconductor chip.

By setting up the circuit-constituting terminal and the first test terminal in the memory semiconductor chip as described above, it is possible to check easily the performance of the memory whose circuit is complicated and whose quality is frequently insufficient because of a special treatment in the process for producing the memory.

The semiconductor device of the present invention includes a first semiconductor chip including a test terminal connected to a line, for terminals, extending from a body of the chip, the test terminal being a terminal for being jointed to a test device, and a circuit-constituting terminal branched from the terminal line and connected to the terminal line, the circuit-constituting terminal being a terminal for being connected to any other circuit element; a second semiconductor chip comprising a circuit element and a terminal, said terminal being connected to the circuit-constituting terminal of the first semiconductor chip; and a circuit substrate for packaging the first and second semiconductor chips.

This structure makes it possible to obtain the semiconductor device wherein the performance of the respective semiconductor chips has been checked. In this packaged semiconductor device, the respective semiconductor chips are usually stacked but the respective semiconductor chips may be two-dimensionally arranged.

In the semiconductor chip of the present invention, for example, the following is desired: the test terminal in the semiconductor chip has been removed.

This structure makes it possible to make the respective semiconductor chips small-sized so that the packaged semiconductor device can be made small-sized.

The process for producing a semiconductor device of the present invention is a process for producing a semiconductor device wherein semiconductor chips, each of which includes a circuit-constituting terminal and a test terminal which are branched from a terminal line, are mounted on/over a circuit substrate. This producing process includes a test step of performing a test by bringing a probe into contact with the test terminal when the semiconductor chips are in a wafer state; a dicing step of cutting the semiconductor chips in the wafer state from each other; and a circuit element connecting step of connecting the circuit-constituting terminal in the semiconductor chip on the circuit substrate to a terminal of any other circuit element on the circuit substrate.

By performing a probe-contacting test using the test terminal exclusive for the test in the state that the semiconductor chip is in a wafer state, the semiconductor chips having insufficient performance can be checked and removed. Therefore, it is possible to save useless labor for mounting the semiconductor chips having insufficient performance and improve efficiency of the production. The wording "a member on the substrate" means "a member directly on the substrate" or "a member superposing on any other circuit element, the substrate".

In the semiconductor device producing process of the present invention, for example, the dicing step may include a test terminal removing step of cutting and removing the test terminal from semiconductor chip.

By removing the test terminal in the dicing step, the respective semiconductor chips can easily be made small-sized. As a result, the semiconductor device can be made small-sized.

In the semiconductor device producing process of the present invention, for example, the following is desired: the circuit element connecting step includes a stacking step of stacking two or more semiconductor chips, at least one of which is the above-mentioned semiconductor chip (including the circuit-constituting terminal and the test terminal which are branched from each other).

This process makes it possible to package the respective semiconductor chips whose performance has been guaranteed at a high surface density and a high integration degree. Thus, the area of semiconductor devices having a high integration degree can be small.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A and 3B are views of a memory in a modification example of the first embodiment of the present invention.

DESCRIPTION OF THE PREFERRED EMBODIMENTS

Embodiments of the present invention will be described hereinafter, referring to the drawings.

[First Embodiment]

Figure 1:
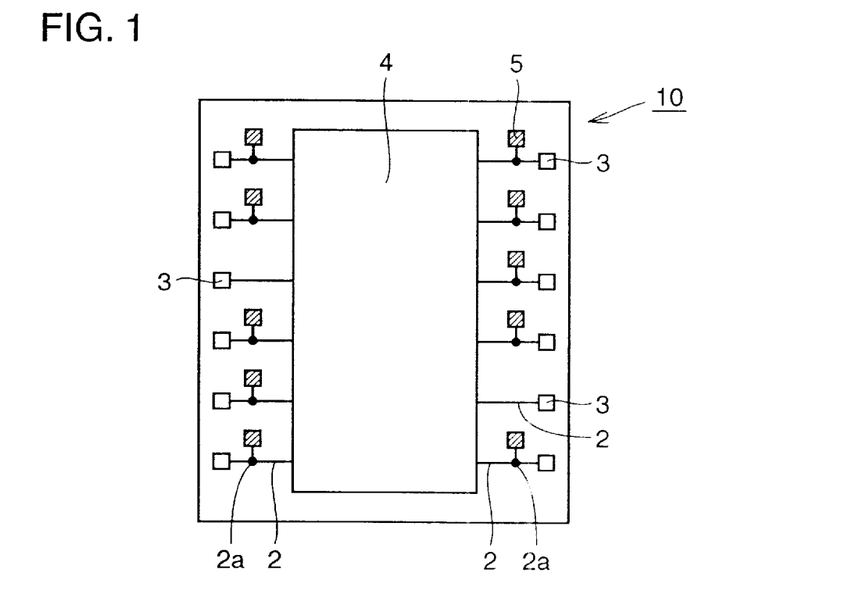
FIG. 1 is a view of a memory in a first embodiment of the present invention.

FIG. 1 is a view of a semiconductor chip in the first embodiment of the present invention. In FIG. 1, a semiconductor chip 10 is a memory such as a DRAM or an SRAM for convenience of description, but may be a logic semiconductor chip. Each terminal line 2 extending from a memory body 1 is divided at a branch portion 2a. A test terminal 3 is attached to the one line of the branched line, and a circuit-constituting terminal 5 is attached to the other line. To some terminal lines 2, test terminal lines, only the test terminal 3 is attached but no circuit-constituting circuit 5 is attached. In other words, the number of the test terminals 3 is larger than that of the circuit-constituting terminals 5. The test terminal 3 may be an output terminal for outputting a signal to a test device, or may be an input terminal for inputting a test signal from a test device to the memory body. Also, the test terminal 3 may be an input/output terminal functioning as the two.

Figure 2:
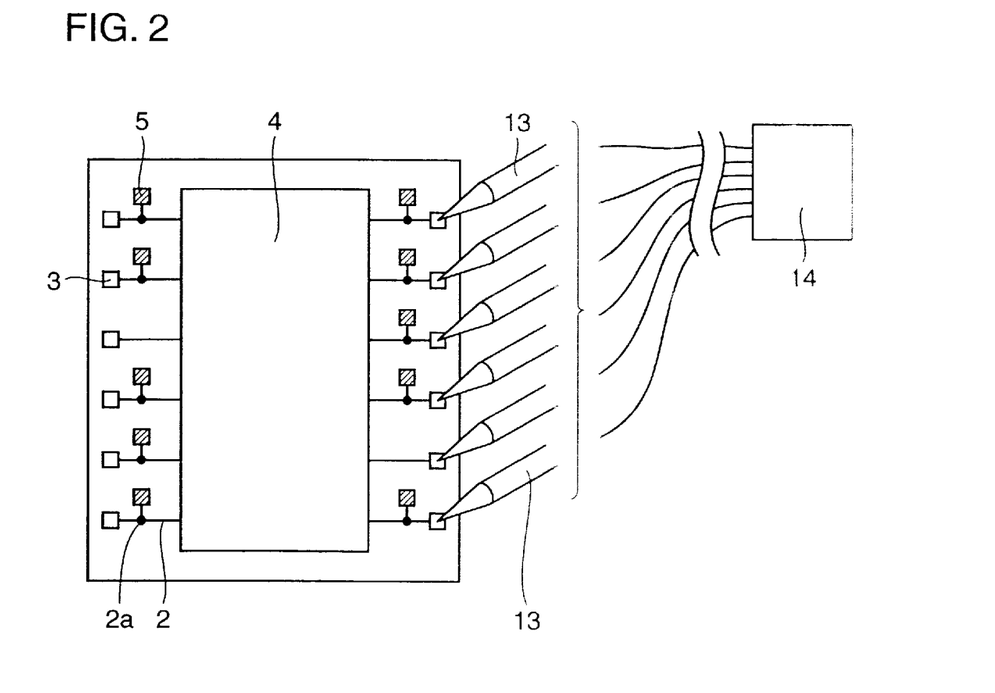
FIG. 2 is a view illustrating a probe-contacting test of the memory in a wafer state and shown in FIG. 1.

FIG. 2 is a view illustrating a probe-contacting test in which probes 13, which are micro-probes, connected to a tester 14 are brought into contact with test terminals of the memory 10 illustrated in FIG. 1, which is at the stage of a wafer. FIG. 2 shows the vicinity of the test terminals. A plurality of the semiconductor chips are formed, adjacently to each other, in a wafer. To produce a packaged semiconductor device, the semiconductor chips are cut and separated from each other by dicing. In each of the semiconductor chips, the number of the test terminals is made larger than that of the circuit-constituting terminals. The terminal wires connected with the test terminals are led out from all sites where the output of a test signal is desired. Therefore, the respective chips can be thoroughly tested. As a result, the performance of their memories can be more thoroughly tested, as compared with conventional chips wherein circuit-constituting terminals also function as memory terminals.

Figure 3A:
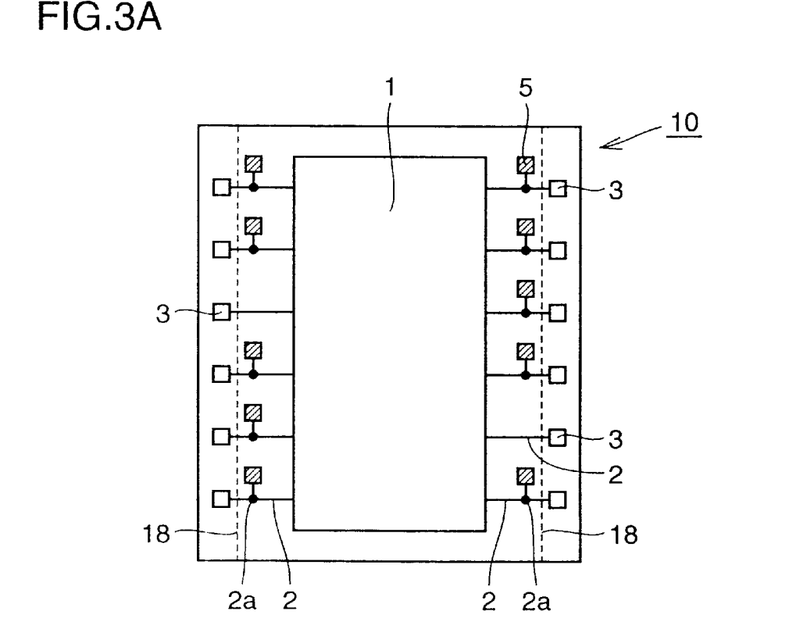
FIG. 3A is a view illustrating the memory before rows of test terminals are cut off.
Figure 3B:
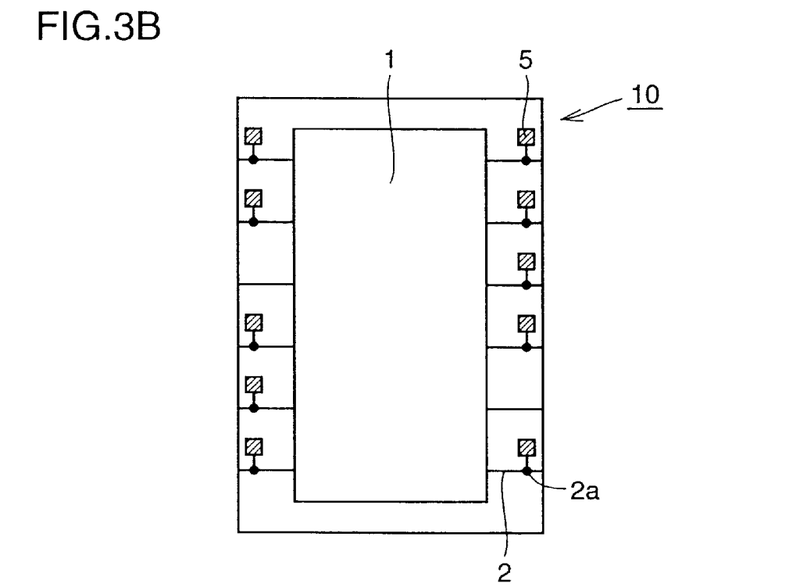
FIG. 3B is a view illustrating the memory after the rows of test terminals are cut off.

FIG. 3 are views of a semiconductor chip of a modification example in the first embodiment of the present invention. This chip is a semiconductor chip wherein test terminals are separated. FIG. 3A is a view illustrating the semiconductor chip before test terminals are cut off, and FIG. 3B is a view illustrating the semiconductor chip after the test terminals are cut off. Referring to FIG. 3A, in the edge portion of the semiconductor chip, test terminals 3 are arranged along the edge and are arranged nearer to the edge than circuit-constituting terminals 5. Separating line 18 are disposed, each of which is between a row of the test terminals and a row of the circuit-constituting terminals. This separating line 18 may be merely drawn as a line or may be made as a groove or perforations along which the row of the test terminals can easily be separated. By testing the semiconductor chips in a wafer state with a tester and then separating the rows of the test terminals along the separating line, it can be promoted to make the semiconductor chips small-sized, as shown in FIG. 3B.

Figure 4:
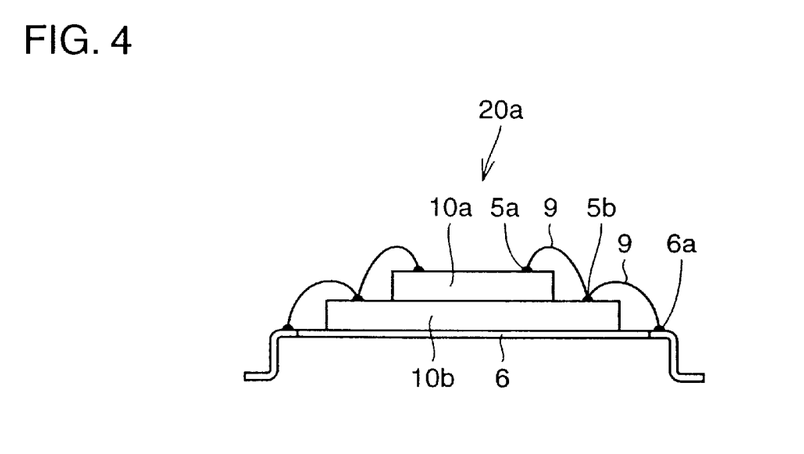
FIG. 4 is a sectional view of a semiconductor device on which the memories in the first embodiment of the present invention are stacked and mounted.
Figure 5:
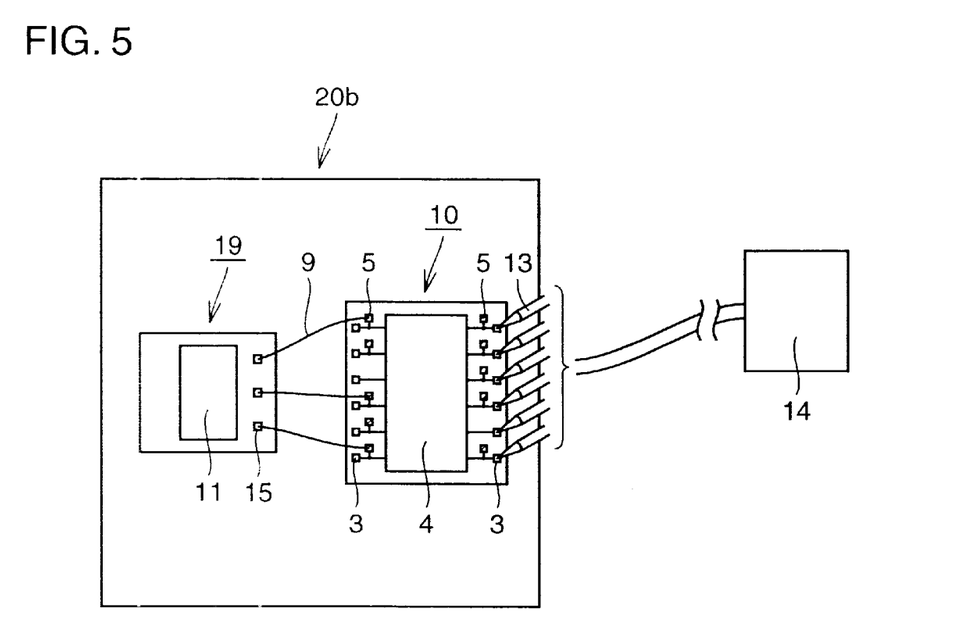
FIG. 5 is a sectional view of a semiconductor device on which the memory in the first embodiment is dimensionally mounted together with another chip.

The above-mentioned memories may be stacked as shown in FIG. 4, or the memory may be mounted together with another chip on a plane, as shown in FIG. 5. In FIG. 4, a packaged semiconductor device 20a is composed of stacked semiconductor chips 10a and 10b. The semiconductor chip at the lower position is a memory chip. The semiconductor chip at the upper position may be a memory chip, or a logic chip such as a CPU or a DSP. Circuit-constituting terminals 5a of the memory 10b mounted on a die pad 6 and so on are connected to circuit-constituting terminals 5b of the semiconductor chip 5b thereon through wires 9. The circuit-constituting terminals 5b of the memory 10b are connected to lead terminals 6a through wires 9. Such stack consolidation makes it possible to produce a small-sized semiconductor device, using memories or logic semiconductor chips whose performance is thoroughly checked.

As illustrated in FIG. 5, a packaged semiconductor device 20b can be produced by consolidating the above-mentioned semiconductor chips on a plane. In FIG. 5, a memory 10 and a CPU 19 are dimensionally consolidated on a single wiring substrate. Only circuit-constituting terminals 15 are connected to terminal lines extending from a CPU body 11, and the circuit-constituting terminals 15 are connected to circuit-constituting terminals 5 of the memory 10 through wires 9. In the case of the dimensional consolidation, it does not occur that the test terminals 3 are hidden by any upper semiconductor chip as is seen in the case of the stack consolidation. Therefore, dimensional consolidation has an advantage that a probe-contacting test can be performed using the tester 14 after the consolidated semiconductor chips are connected to each other through the wires. It is the same as in the case of the stack consolidation that the respective dimensionally-consolidated semiconductor chips are thoroughly tested using the test terminals exclusive for the test, the number of which is sufficiently large, and their performance is checked.

[Second Embodiment]

Figure 6A:
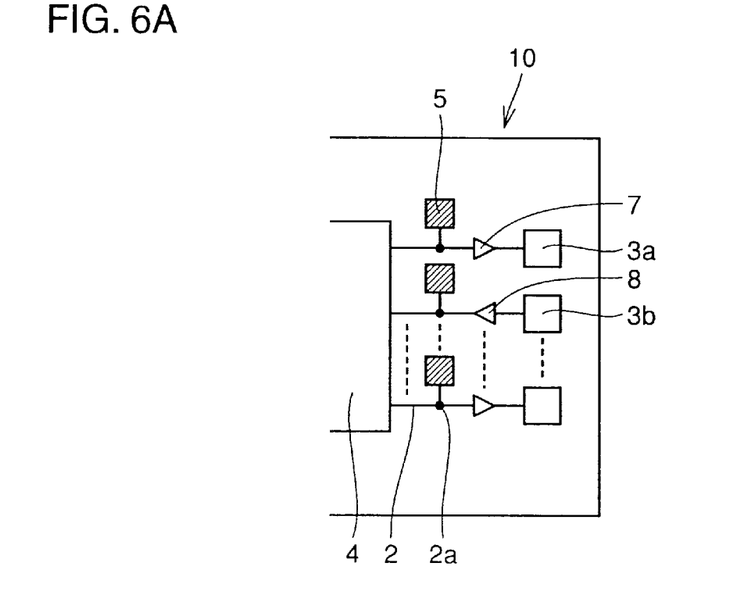
FIG. 6A is a view of a memory in a second embodiment of the present invention.

FIG. 6A is a view of a semiconductor chip in the second embodiment of the present invention. This semiconductor chip is a memory for conveniences of description, but may be a logic semiconductor chip. A semiconductor chip 10 in the present embodiment is characterized in that its test terminals are divided into outputting terminals and inputting terminals and the test terminals are provided with drivers. Each wire 2 for terminals which is led out from a memory body 4 is branched at a branch portion 2a. One of the wires from the branch portion is provided with a circuit-constituting terminal 5 and the other thereof is connected to a test terminal 3a or 3b having a driver 7 or 8. The outputting terminal 3a has an output driver, and the inputting terminal 3b has an input driver.

Figure 6B:
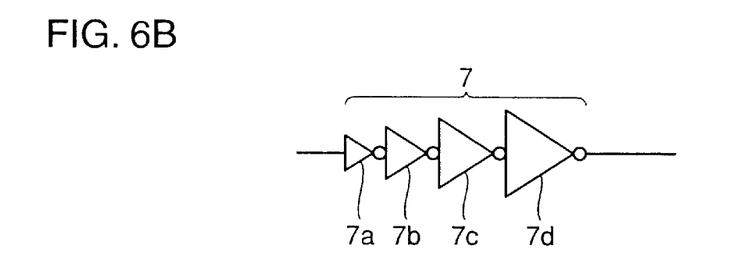
FIG. 6B is a view of an output driver thereof.
Figure 6C:
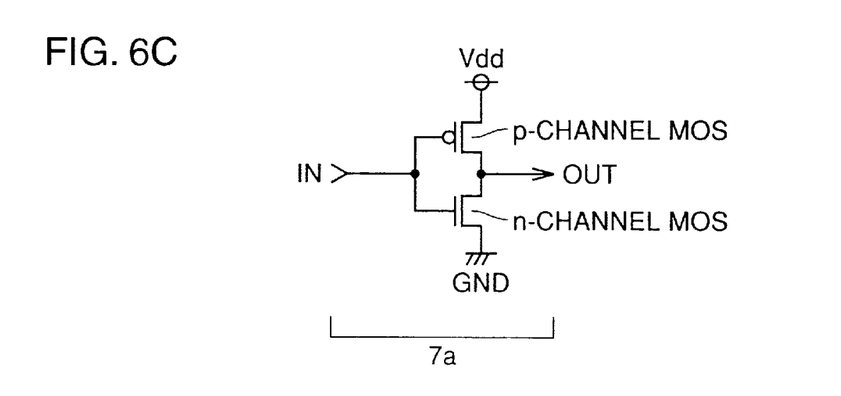
FIG. 6C is a circuit diagram of each inverter.
Figure 7:
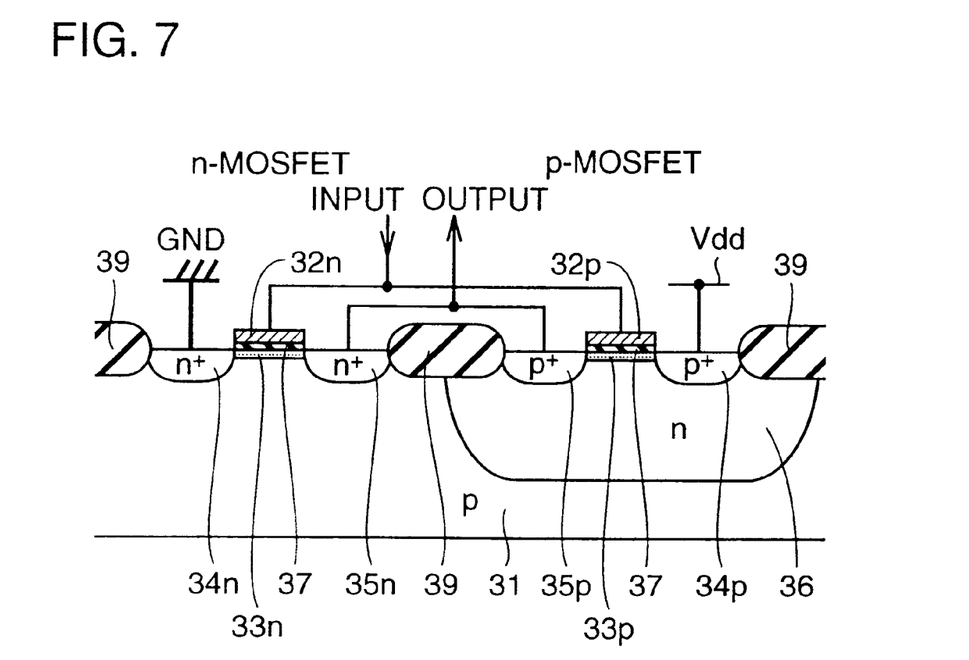
FIG. 7 is a sectional view of the inverter illustrated in FIG. 6C.

As described above, a conventional terminal functions as a circuit-constituting terminal and a test terminal. This conventional terminal has a structure for outputting an output signal having a necessary and minimum intensity in order to make the parasitic capacitance of the memory body as small as possible and make the circuit structure of the memory body simpler. Therefore, even an output signal sufficient for the circuit is insufficient for the test. Thus, any test with a high-speed operation and so on cannot be thoroughly performed. In the present embodiment, an outputting inverter 7 is set up as the output driver for the output terminal 3a to amplify the output signal. FIG. 6B illustrates the output driver 7 composed of four inverters 7a, 7b, 7c and 7d. As illustrated in FIG. 6C, in the case that each of the inverters is composed of a MOSFET, the channel width of the inverter present at a latter position is made larger. Thus, the output signal is amplified. Each of the inverters composed of the MOSFETs may have, for example, a structure shown in FIG. 7. The channel width of the MOSFET of the inverter circuit illustrated in FIG. 7 indicates the depth (perpendicularity to the paper) of channels 33n and 33p underlying, across a gate insulating film 37, gates 32n and 32p. By making the depth of the inverter present at a latter position longer, an intense output signal can easily be outputted to an output test terminal 3a. As illustrated in FIG. 6C, this inverter circuit is composed of an n channel MOS including a source 34n and a drain 35n and a p channel MOS including a source 34p and a drain 35p.

Figure 8:
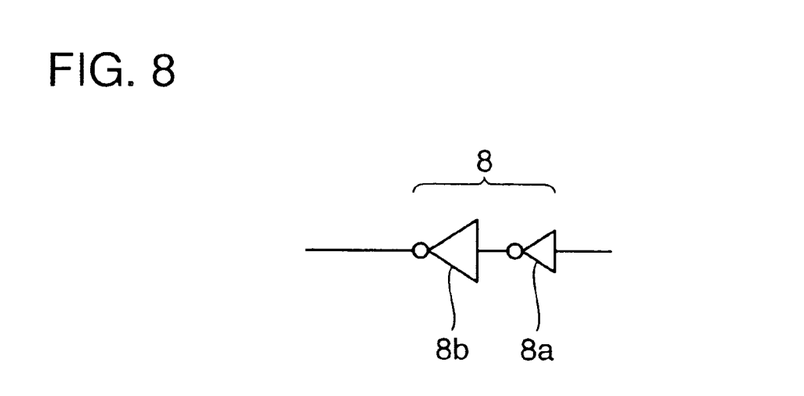
FIG. 8 is a view of an input driver.

FIG. 8 is a view illustrating an inputting inverter 8 set up as an inputting driver. Since it is not particularly necessary to increase power for driving the inputting inverter, it is sufficient that the waveform of any input signal is shaped. Therefore, the channel widths of respective inverters 8*a* and 8*b* are made small.

By using the semiconductor chip of the above-mentioned embodiment, a testing output signal having a level making thoroughgoing test possible can be outputted without increasing the parasitic capacitance in the semiconductor chip body such as a memory or making the structure of the circuit still more complicated. Needless to say, in this semiconductor chip, the rows of the test terminals are cut off after the end of the test to be made small-sized.

Figure 9:
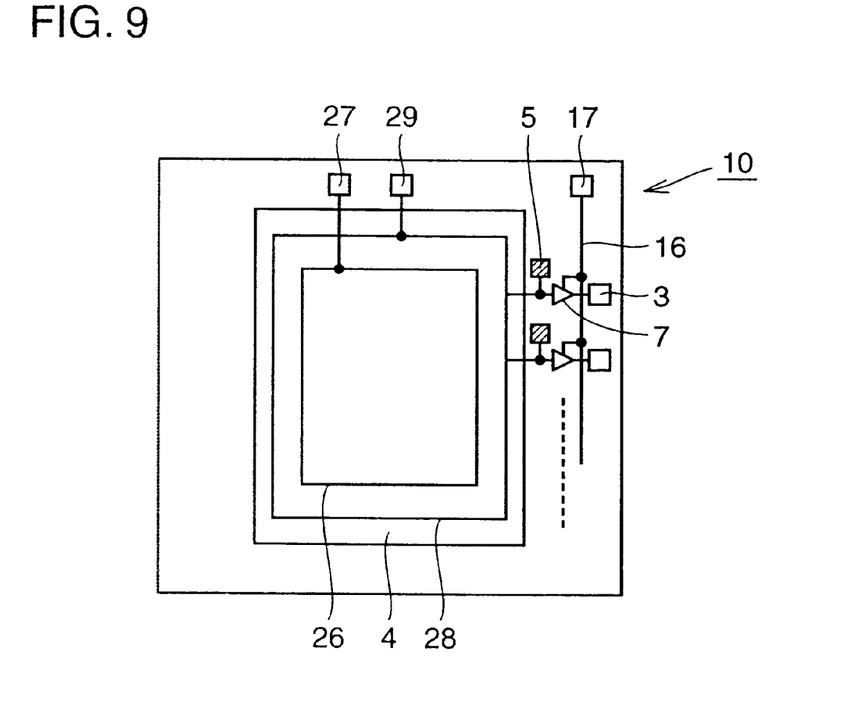
FIG. 9 is a view of a memory of a modification example in the second embodiment of the present invention.

FIG. 9 is a view of a semiconductor chip of a modification example in the second embodiment of the present invention. In FIG. 9, a power source of a semiconductor chip body and a power source, for drivers, fitted to test terminals are separated from each other. That is, a power source terminal 17 for drivers is set up and a given voltage is supplied to each driver 7 through a power source wire 16 for drivers. FIG. 9 illustrates only voltage-supply to the outputting drivers. Needless to say, however, a system for supplying voltage to inputting drivers may be separately set up. The semiconductor chip body is provided with a power source terminal 29 and a power source line 28 connected to the body 4, and a ground terminal 27 and a ground line 26 connected to the body 4. In the present second embodiment, the driver power source terminal is set up separately from the body power source as shown in FIG. 9. Thus, in the state that the effect thereof on the body is made still smaller, it is possible to output a testing signal having an intensity sufficient for a thoroughgoing test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor chip comprising:

a first test terminal connected to a terminal line that extends from a body of said chip, said first test terminal being a terminal for being jointed to a test device, a circuit-constituting terminal branched from said terminal line and connected to said terminal line, said circuit-constituting terminal being a terminal for being connected to any other circuit element, and a driver disposed at a position between said first test terminal and said branch point.

2. The semiconductor chip according to claim 1, wherein said driver is for amplifying a signal to said test device.

3. The semiconductor chip according to claim 1, wherein said driver is for transmitting a signal from said test device to said semiconductor chip.

4. The semiconductor chip according to claim 1, wherein said driver is composed of an inverter circuit comprising a MOS transistor.

5. The semiconductor chip according to claim 4, wherein said inverter circuit is composed of multistage inverter circuits; and two of said MOS transistors in said inverter circuits adjacent to each other, the channel width of said MOS transistor in said inverter circuit nearer to the side to which said signal is transmitted is longer.

6. The semiconductor chip according to claim 1, which further comprises a driver power source terminal for said driver.

* * * * *